(12) United States Patent
Smith et al.

(10) Patent No.: US 7,867,886 B2
(45) Date of Patent: Jan. 11, 2011

(54) METHOD OF ENCLOSING A MICRO-ELECTROMECHANICAL ELEMENT

(75) Inventors: Charles Gordon Smith, Cambridge (GB); Robertus P. Van Kampen, Den Bosch (GB)

(73) Assignee: Cavendish Kinetics, Ltd, San Jose, CA (US)

( * ) Notice: Subject to any disclaimer, the term of this patent is extended or adjusted under 35 U.S.C. 154(b) by 421 days.

(21) Appl. No.: 12/085,428

(22) PCT Filed: Nov. 22, 2006

(86) PCT No.: PCT/GB2006/004350

§ 371 (c)(1),
(2), (4) Date: May 22, 2008

(87) PCT Pub. No.: WO2007/060414

PCT Pub. Date: May 31, 2007

(65) Prior Publication Data

US 2009/0298215 A1     Dec. 3, 2009

(30) Foreign Application Priority Data

Nov. 22, 2005  (GB) ................................. 0523713.6

(51) Int. Cl.
*H01L 21/445* (2006.01)
*B81C 1/00* (2006.01)
*H01L 23/525* (2006.01)

(52) U.S. Cl. ................. 438/598; 438/601; 438/641; 438/677; 257/E21.479; 257/E21.507

(58) Field of Classification Search .............. 438/598, 438/601, 622, 637, 641, 674, 677; 257/E23.507, 257/E21.479
See application file for complete search history.

(56) References Cited

U.S. PATENT DOCUMENTS

| 4,668,532 | A  | * | 5/1987  | Moisan et al.  | ................ 29/852 |
| 5,368,634 | A  | * | 11/1994 | Hackett        | ................ 95/260 |
| 5,746,903 | A  | * | 5/1998  | Beilin et al.  | ................ 205/118 |
| 5,861,344 | A  |   | 1/1999  | Roberts et al. |                        |
| 6,544,585 | B1 | * | 4/2003  | Kuriyama et al.| ................ 216/18 |

(Continued)

FOREIGN PATENT DOCUMENTS

EP          1433740 A1    6/2004

OTHER PUBLICATIONS

Search report and written opinion for PCT/US2009/033927 (CK051PCT) dated Jan. 7, 2010.

*Primary Examiner*—Mary Wilczewski
(74) *Attorney, Agent, or Firm*—Patterson & Sheridan, LLP (57) ABSTRACT

A method, in a complementary metal oxide semiconductor fabrication process, of creating a layered housing containing a micro-electromechanical system device, the method comprising the steps of providing a cavity in at least one layer of the housing, the cavity being accessible through via holes in a layer of insulating material deposited thereon, and the layer of insulating material being covered by a thin film layer of conductive material. The method further comprises the step of hydrophobically treating at least a portion of the inner surface of the cavity. Finally the method comprises the steps of submerging the wafer in an electroplating solution and electroplating a conductive layer onto the thin film layer of conductive material such that the cavity remains free of electroplating solution.

12 Claims, 8 Drawing Sheets

U.S. PATENT DOCUMENTS

| | | | |
|---|---|---|---|
| 6,610,600 B2* | 8/2003 | Yeh | 438/678 |
| 6,626,196 B2* | 9/2003 | Downes et al. | 134/184 |
| 6,767,764 B2* | 7/2004 | Saia et al. | 438/118 |
| 6,773,962 B2* | 8/2004 | Saia et al. | 438/118 |
| 7,119,557 B2* | 10/2006 | Lee | 324/754 |
| 7,123,119 B2* | 10/2006 | Pashby et al. | 333/262 |
| 7,687,296 B2* | 3/2010 | Yoshida | 438/48 |
| 2002/0173080 A1* | 11/2002 | Saia et al. | 438/118 |
| 2004/0020782 A1 | 2/2004 | Cohen et al. | |
| 2004/0171135 A1* | 9/2004 | Ostuni et al. | 435/283.1 |
| 2006/0139038 A1* | 6/2006 | Lee | 324/754 |
| 2007/0023890 A1* | 2/2007 | Haluzak et al. | 257/704 |
| 2007/0119048 A1* | 5/2007 | Li et al. | 29/623.5 |
| 2007/0128716 A1* | 6/2007 | Wang et al. | 435/305.1 |
| 2007/0209437 A1* | 9/2007 | Xue et al. | 73/514.31 |
| 2007/0235501 A1 | 10/2007 | Heck | |

* cited by examiner

METHOD OF ENCLOSING A MICRO-ELECTROMECHANICAL ELEMENT

The present invention relates to the protection of micro-electromechanical elements for use in, for example, semiconductor devices.

Structures such as micro-electromechanical elements and micro-fuses can be formed on Complimentary Metal Oxide Semiconductor (CMOS) substrates and have significant applications in a variety of technical areas. These structures are typically housed in cavities formed upon or within complimentary metal oxide semiconductor (CMOS) devices.

An example of a micro-electromechanical element which must operate in a cavity is a micro-fuse element which fuses upon application of a predetermined current. Micro-electromechanical elements are known to be sensitive to their operational environments. These include thermal, chemical and mechanical exposure which may be detrimental to the performance of the semiconductor device. Accordingly, micro-electromechanical elements operating within a cavity should be able to freely function without interference from their environment. To resolve this problem, several methods of packaging micro-electromechanical devices have been developed. However, these packaging procedures can often damage the micro-electromechanical device that is housed in a cavity.

Because of this, there has been a clear need to provide a micro-electromechanical device which is protected from its environment by some form of protective seal.

Prior art solutions for applying protective seals for such elements include the provision of passivation layers formed above the micro-electromechanical elements using Chemical Vapour Deposition (CVD) or Physical Vapour Deposition (PVD). However, these layers often add several process steps to the overall encapsulation process and, it is known in the art that most PVD and CVD deposition processes deposit material more quickly on the top of the wafer rather than on the sides of patterned features. Because typical sacrificial release holes have a width comparable to the interlayer dielectric's thickness or metalization thickness, in order to seal the release holes, layers which are thicker than these will need to be deposited.

Therefore, it is an object of the present invention to provide a reliable enclosure for the micro-electromechanical element or fuse element in the form of hermetic seals, without increasing the size and cost of the devices.

In order to provide a solution to the problems associated with the prior art, the present invention provides a method, in a complementary metal oxide semiconductor fabrication process, of creating a layered housing containing a micro-electromechanical system device, the method comprises the steps of:

providing a cavity in at least one layer of the housing, the cavity being accessible through via holes in a layer of insulating material deposited thereon, and the layer of insulating material being covered by a thin film layer of conductive material;

hydrophobically treating at least a portion of the inner surface of the cavity;

submerging the wafer in an electroplating solution; and electroplating a conductive layer onto the thin film layer of conductive material such that the cavity remains free of electroplating solution.

The step of providing a cavity may further comprise the steps of:

providing a micro-electromechanical system device on a first layer of sacrificial material;

depositing a second layer of sacrificial material on at least a portion of the micro-electromechanical system device;

depositing a layer of insulating material on the layer of sacrificial material;

depositing at least one thin film layer of conductive material on the layer of insulting material;

patterning and etching via holes so as to expose at least a portion of the second layer of sacrificial material; and removing, through the via holes, at least a portion of the first and second layers of sacrificial material by way of etching, thereby defining a cavity in which at least a portion of the micro-electromechanical system device is contained.

The step of providing a cavity may further comprise the steps of:

providing a micro-electromechanical system device on a first layer of sacrificial material;

depositing a second layer of sacrificial material on at least a portion of the micro-electromechanical system device;

depositing a layer of insulating material on the second layer of sacrificial material;

patterning and etching via holes so as to expose at least the second layer of sacrificial material;

removing, through the via holes, at least a portion of the first and second layers of sacrificial material by way of etching, thereby defining a cavity in which at least a portion of the micro-electromechanical system device is contained; and depositing at least one thin film layer of conductive material on the layer of insulating material and the inner surfaces of the via holes.

Preferably, the step of electroplating a conductive layer further comprises the step of:

minimizing the change in temperature during the electroplating process.

Preferably, the step of electroplating a conductive layer further comprises the step of:

minimizing the vibration of the thin film layer during the electroplating process.

Preferably, the step of hydrophobically treating at least a portion of the inner surface of the cavity further comprises:

treating the at least a portion of the inner surface of the cavity using a fluoride-based dry etch or a liquid based hydrofluoric etch.

Preferably, the method further comprises the step of removing at least a portion of the electroplated layer using planarisation.

Preferably, the planarisation step is conducted using Chemical-Mechanical polishing.

Preferably, the electroplated layer is a layer of copper.

Preferably, the electroplating solution comprises at least copper and sulfuric acid.

Preferably, the or each thin film layer is selected from one or more of the group of Titanium, Tantalum, Copper and Aluminium.

As will be appreciated by a person skilled in the art, the present invention provides several advantages over the prior art. One advantage is that, because the inner surface of the cavity is hydrophobically treated, a bubble of gas will be formed in the cavity when the thin film layer is submerged in the electroplating material. Accordingly, no electroplating solution will find its way into the cavity and the cavity will therefore remain empty after the electroplating step has been completed. Therefore, the micro-electromechanical device will not be adversely affected by the presence of electroplating solution inside the cavity.

Moreover, because the present invention is specifically suitable for copper processes, the cavity can be sealed during the normal process of creating a metalization, thereby reducing the number of extra process steps required to create the seal. Accordingly, because the step of hydrophobically treating the inner surface of the cavity can be performed using back end of copper processes, the resulting encapsulation technique will be faster, simpler and more cost effective than known methods.

Examples of the present invention will now be described with reference to the accompanying drawings, in which:

FIG. 11 shows another embodiment of the present invention where

Figure 1:
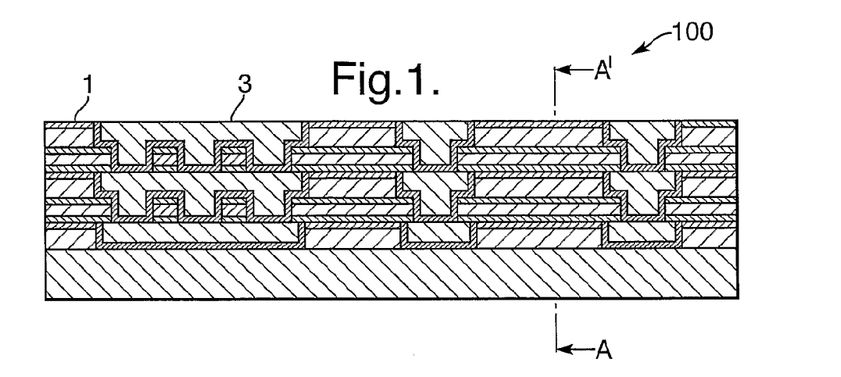
FIG. 1 shows a cross-section of a wafer processed by a standard dual damascene process up to the last metal.
Figure 1A:
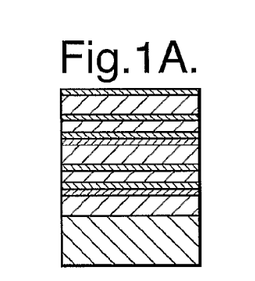
FIG. 1A shows a cross-section of the wafer of FIG. 1 along line A-A'.
Figure 2:
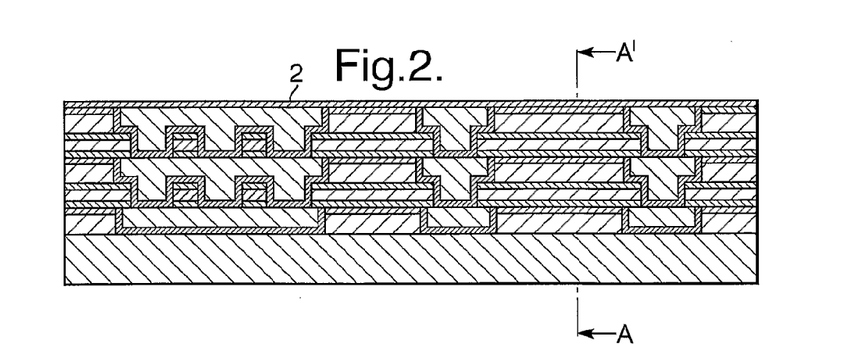
FIG. 2 shows a cross-section of the wafer of FIG. 1, where a fuse metallisation layer has been deposited on the substrate.
Figure 2A:
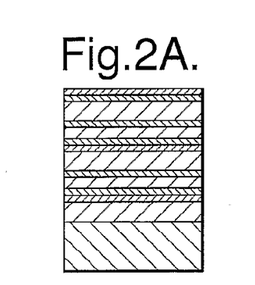
FIG. 2A shows a cross-section of the wafer of FIG. 2 along line A-A'.
Figure 3:
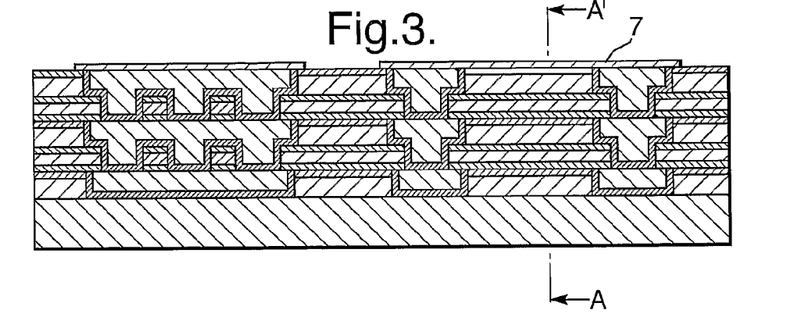
FIG. 3 shows a cross-section of the wafer of FIG. 2, where the metallisation layer has been patterned and etched into a fuse element.
Figure 3A:
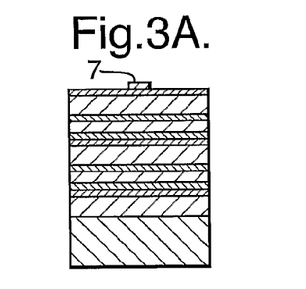
FIG. 3A shows a cross-section of the wafer of FIG. 3 along line A-A'.

A first example of the present invention is shown in FIGS. 1 to 10 which describe various stages in the fabrication of a micro-electromechanical element (such as a fuse element) which is to be encapsulated by means of copper plating. Referring to FIGS. 1 and 1A, to fabricate the fuse element, the wafer 100 is processed by a standard dual damascene process up to the last metal layer. Then, a Silicon Nitride layer 1 is etched back to the copper via level 3 using chemical mechanical polishing (CMP). Referring now to FIGS. 2, 2A, 3 and 3A, a fuse metallisation layer 2 is then deposited. The metallisation layer may be a metallic nitride layer, such as Titanium Nitride. Then, the metallisation layer is patterned and etched into a desired pattern forming the micro-electromechanical fuse element 7.

Figure 4:
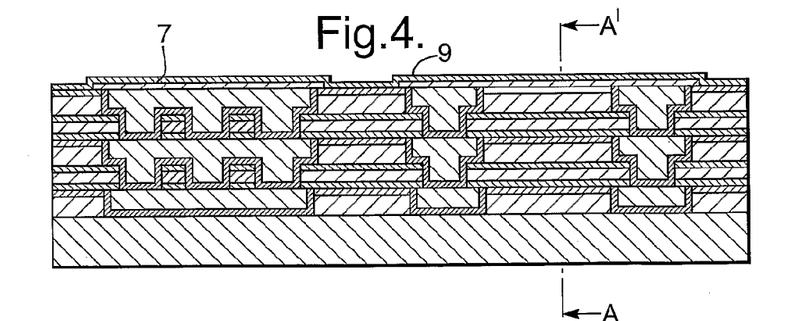
FIG. 4 shows a cross-section of the wafer of FIG. 3, where a Silicon Nitride sacrificial layer has been deposited over the fuse element and the substrate.
Figure 4A:
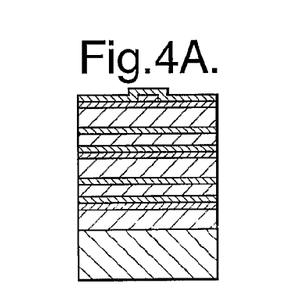
FIG. 4A shows a cross-section of the wafer of FIG. 4 along line A-A'.
Figure 5:
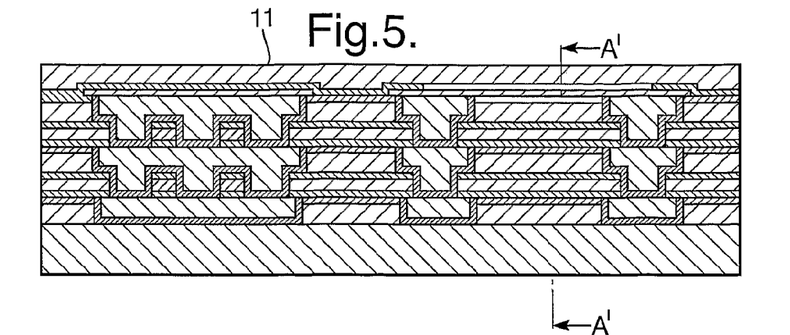
FIG. 5 shows a cross-section of the wafer of FIG. 3, where a interlayer dielectric (ILD) layer in the form of a silicon dioxide insulating layer has been deposited above the sacrificial layer.
Figure 5A:
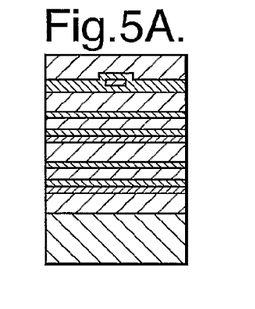
FIG. 5A shows a cross-section of the wafer of FIG. 5 along line A-A'.

Referring now to FIG. 4, the next step of the method sees a Silicon Nitride sacrificial layer 9 being deposited and patterned above the fuse micro-electromechanical element 7. In FIG. 5, an interlayer dielectric (ILD) layer in the form of a silicon dioxide insulating layer 11 has been deposited above the sacrificial layer 9. Now, referring to FIG. 6, release holes 14 (or via holes) are patterned and etched into the insulating layer 11, through which an etchant subsequently flows so as to remove the sacrificial layers below and above the fuse element, thereby defining a cavity in which the fuse element 7 is suspended.

Figure 6:
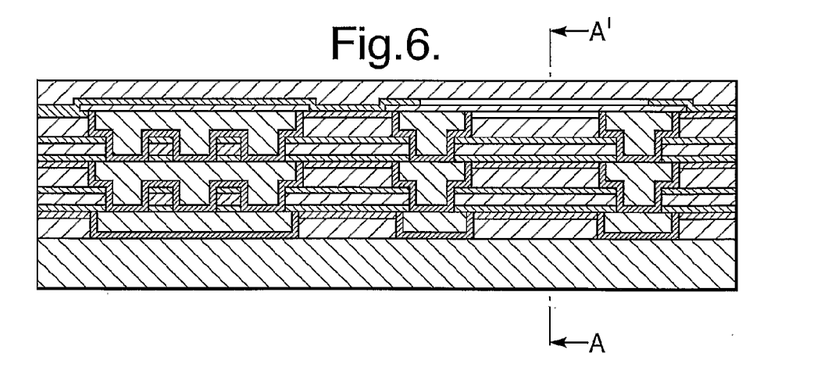
FIG. 6 shows a cross-section of the wafer of FIG. 5, where release holes have been etched into the insulating layer.
Figure 6A:
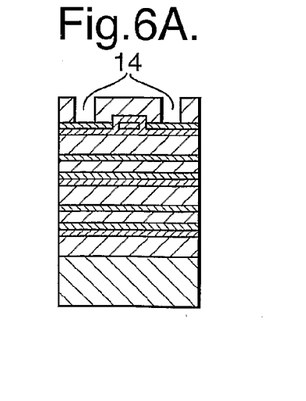
FIG. 6A shows a cross-section of the wafer of FIG. 6 along line A-A'.
Figure 7:
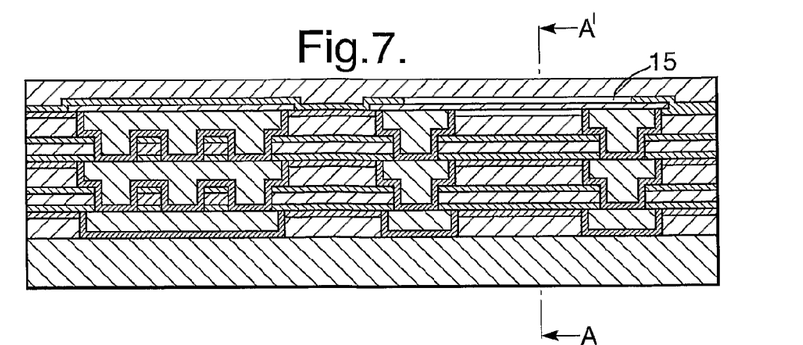
FIG. 7 shows a cross-section of the wafer of FIG. 6, where the sacrificial material has been etched away.
Figure 7A:
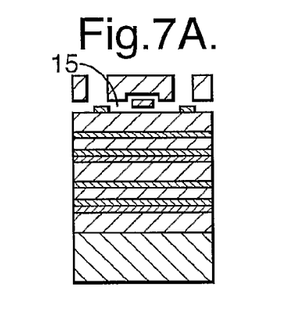
FIG. 7A shows a cross-section of the wafer of FIG. 7 along line A-A'.

In the present embodiment, once the sacrificial layers have been removed, encapsulating layers are applied over the fuse micro-electromechanical element beginning with the deposition of a barrier layer which lines the release holes and the upper surface of the insulating layer. The barrier layer may be applied using conventional CVD or PVD methods known to a skilled person.

The next step in the method comprises hydrophobically treating at least a portion of the inner surface of the cavity. This can be performed using a fluoride-based dry etch, a liquid based hydrofluoric etch or other known methods. The provision of a hydrophobic treatment will prevent the electroplating solution of the following step to enter the cavity. The wafer is then submerged in an electroplating solution.

Figure 8:
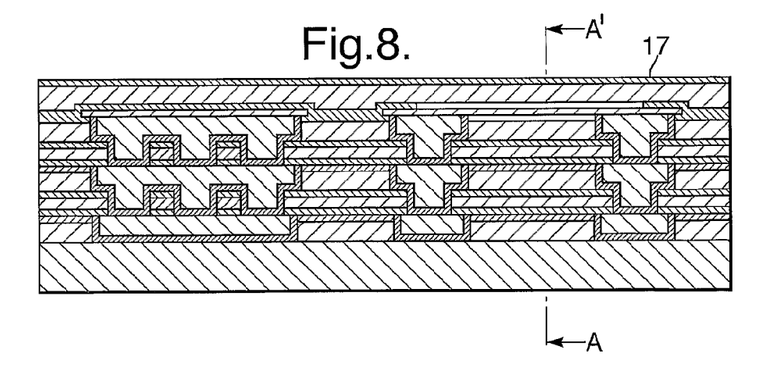
FIG. 8 shows a cross-section of the wafer of FIG. 7, where a barrier layer has been provided such that it lines the release holes and the upper surface of the insulating layer.
Figure 8A:
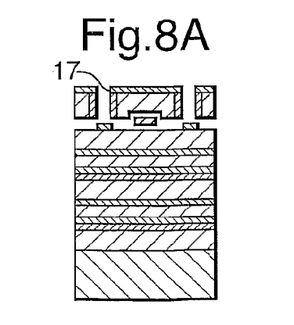
FIG. 8A shows a cross-section of the wafer of FIG. 8 along line A-A'.

Now, with referring to FIG. 8, barrier layer 17 lining the release holes 14 and the upper surface of the barrier layer 17 is electroplated with a layer of metal derived from an electroplating solution that follows the contours of the surface of the barrier layer 17 and at least partly fills the release holes 14 without deposition of the metal into the cavity 15 containing the fuse element 7. Again, the solution is prevented from entering the cavity, because the inside of the cavity has been treated with a fluorine-based treatment which makes it hydrophobic. This leaves a bubble of gas in the cavity which prevents the inside being wetted by the solution.

Figure 9:
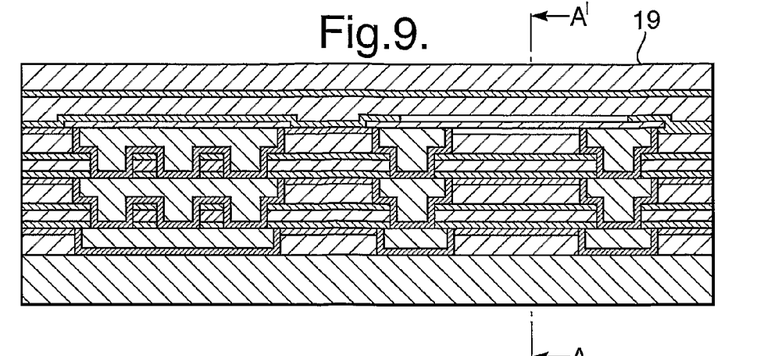
FIG. 9 shows a cross-section of the wafer of FIG. 8, where an electroplating layer has been deposited without deposition of metal into the cavity containing the fuse element.
Figure 9A:
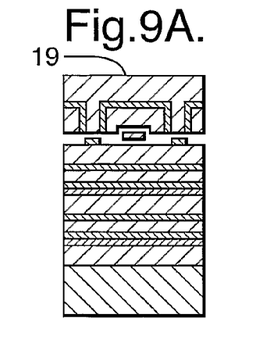
FIG. 9A shows a cross-section of the wafer of FIG. 9 along line A-A'.

By controlling the temperature and the vibration of the wafer during the electroplating step, the pressure in the cavity can be controlled to prevent the liquid entering further. This is shown in FIG. 9. Barrier layer 17 may comprise tantalum nitride (TaN) and, in the present embodiment, may be applied using Chemical Vapour Synthesis (CVS). The electroplating step involves copper plating of the wafer 100 from a copper electroplating solution. The barrier layer 17 and the presence of discontinuities within the release holes prevent the flow of the copper electroplating solution into the cavity 15.

Figure 10:
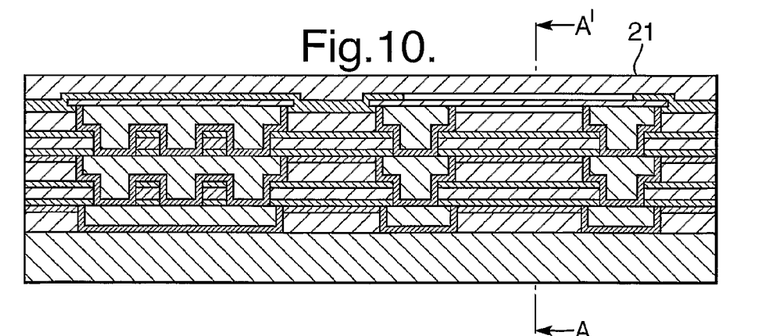
FIG. 10 shows a cross-section of the wafer of FIG. 9, where the wafer has been submitted to chemical mechanical polishing (CMP) in order to planarise the metal layer and barrier layer.
Figure 10A:
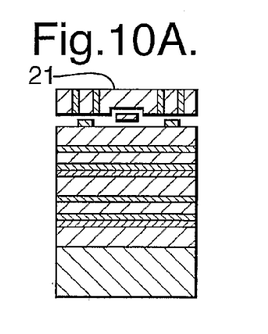
FIG. 10A shows a cross-section of the wafer of FIG. 10 along line A-A'.

Now, referring to FIG. 10, once the copper layer 19 has been applied, chemical mechanical polishing (OMP) is used to planarise the copper layer 19 and barrier layer 17 back to layer 21. This may be followed by the addition of further passivation layers as described below.

Figure 11:
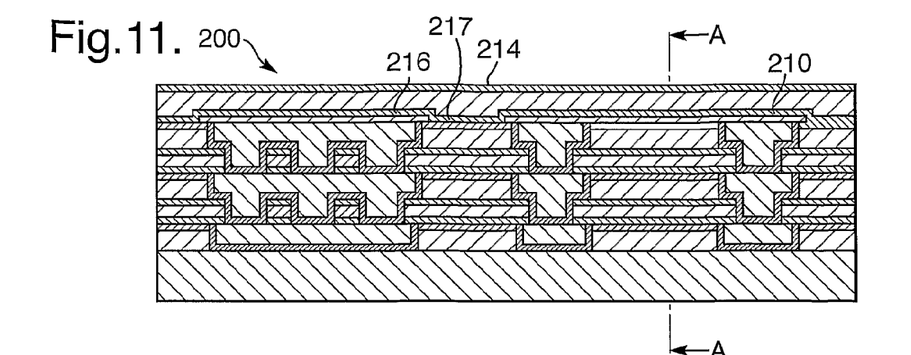
FIG. 11 shows a cross-section of a wafer according to a second example of the present invention, where a thin film of conducting material has been applied on the insulating layer.
Figure 11A:
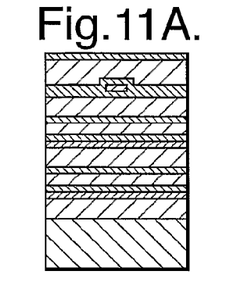
FIG. 11A shows a cross-section of the wafer of FIG. 11 along line A-A'.

Now, with reference to FIGS. 11 to 14, a second example of the present invention will now be described. FIG. 11 shows the cross-section of a CMOS semiconductor wafer 200 embodying the present invention comprising a substrate, an interlayer dielectric layer, a seed layer, a conducting plug, a fuse element layer 210 having deposited thereon an insulating layer 212, and a thin film 214 of conducting material applied on the insulating layer 212. In particular, the steps described hereinbefore are used for providing a dual damascene copper wafer.

Referring to FIG. 11, a sacrificial layer 216 is formed on at least part of an etched conducting layer 210, as shown. The sacrificial layer 216 may be formed from silicon nitride, for example, and typically deposited by Low Pressure Chemical Vapour Deposition (LPCvD) or Plasma Enhanced Chemical Vapor Deposition (PECVD). A fluorine-based compound would be suitable for etching a Silicon Nitride sacrificial layer.

In a next step, an insulator, namely an inter-level dielectric layer (ILD) 212 is formed on the sacrificial layer 216, and may be formed, for example, from silicon oxide. This layer may be applied by an oxide deposition process such as Chemical Vapour Deposition (CVD). The next step in this example of the present invention is to deposit a thin film of barrier material 214 (also known as the seed layer) over the insulating layer 212.

The thin barrier layer 214 is applied on the wafer 200 by sputtering or chemical vapour deposition processes. Barrier layer 214 is formed from a barrier metal selected from a group consisting of titanium (Ti), tantalum (Ta), tungsten (W) or nitrides thereof, tantalum nitride (TaN) or titanium nitride (TiN), which barrier layer has the function of preventing the diffusion of copper into the underlying wafer and which also acts as an electrically conductive layer.

The barrier layer 214 should be sufficiently thick so as to prevent the diffusion of copper (Cu) into the underlying device layers, which would be detrimental to the performance of the device. A barrier layer 214 thickness in the embodiment of the present invention may be of the order of nanometers to microns.

Figure 12:
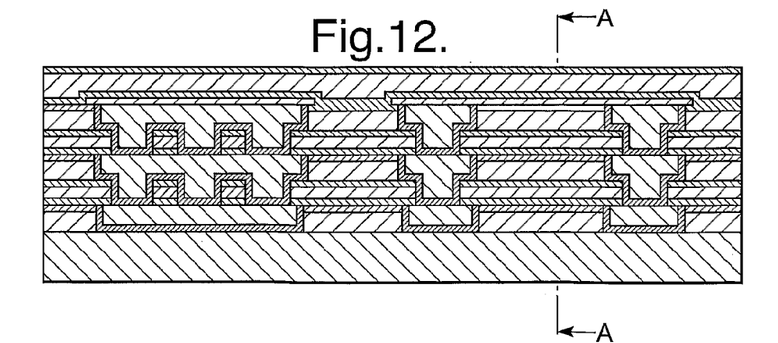
FIG. 12 shows a cross-section of the wafer of FIG. 11, where release holes have been patterned and etched using standard lithographic precesses.
Figure 12A:
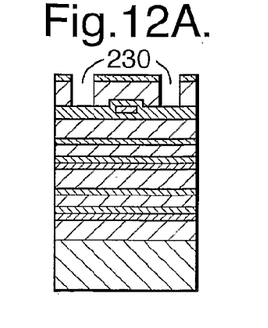
FIG. 12A shows a cross-section of the wafer of FIG. 12 along line A-A'.

Referring to FIG. 12, for the micro-electromechanical element to be operable, the sacrificial layers 216, 217 must be removed so as to permit the movement of the structural element or, in the case of a fuse element, permit blowing of the fuse without causing damage to the underlying substrate. Therefore, in the next step, release holes 230 are patterned and etched, using standard lithographic processes known to the skilled addressee, and are formed through the barrier layer 214 and the underlying insulating layer 212 to make the sacrificial layers 216, 217 accessible to subsequent removal steps.

Figure 13:
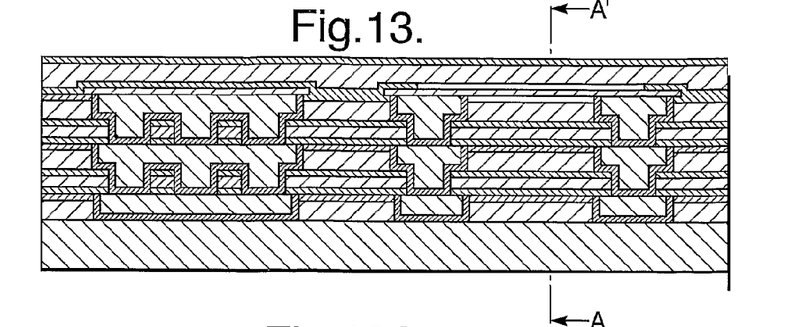
FIG. 13 shows a cross-section of the wafer of FIG. 12, where the sacrificial material has been etched away.
Figure 13A:
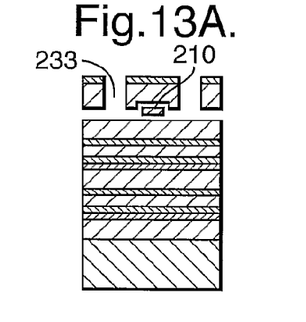
FIG. 13A shows a cross-section of the wafer of FIG. 13 along line A-A'.

Referring to FIG. 13, an etchant is introduced through release holes 230 so as to remove the sacrificial layers and expose the structural element 210 within the cavity 233. It will be appreciated that the etchant introduced through the release holes 230 should not have a detrimental interaction with the structural element 210 as this may lead to poor performance of the device. The sacrificial layer may be removed by means of a dry etch, for example, a fluorine gas source such as nitrogen tri-fluoride or sulphur hexafluoride for a silicon nitride sacrificial layer.

The next step in the method comprises hydrophobically treating at least a portion of the inner surface of the cavity and the inner walls of the release holes 230. This can be performed using a fluoride-based dry etch, a liquid based hydrofluoric etch or other known methods. The provision of a hydrophobic treatment will make it more difficult for the electroplating solution of the following step to enter the cavity. The wafer is then submerged in an electroplating solution.

Again, the solution does not enter the release holes because, in this embodiment, they are treated so as to be hydrophobic. This leaves a bubble of gas in both the cavity and the release holes, thereby preventing the inside of the cavity and the inside of the release holes from being wetted by the solution. By controlling the temperature and the vibration of the wafer during the electroplating step, the pressure in the cavity can be controlled to prevent the liquid entering the release holes. The plating process is such that as the copper layer becomes thicker around the holes, it also plates laterally at the same rate closing over the top of the hole. Further, it is desirable that the conducting layer fills any microscopic release holes in the surface of the wafer. In this example of the present invention, the wafer 200 is immersed into a copper plating solution so as to seal the release holes 230 formed through the thin film 214 and the underlying insulating layer 212 as defined in the previous step of the present invention.

Figure 14:
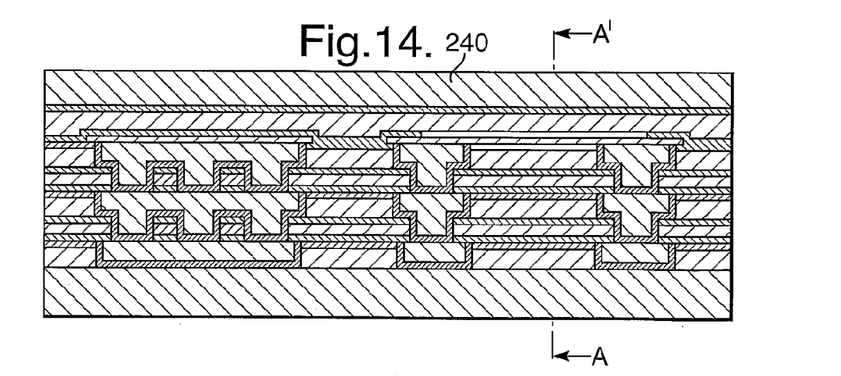
FIG. 14 shows a cross-section of FIG. 13, where a copper plating solution has been provided above the thin film.
Figure 14A:
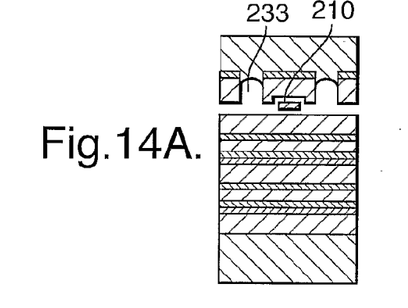
FIG. 14A shows a cross-section of the wafer of FIG. 14 along line A-A'.
Figure 15:
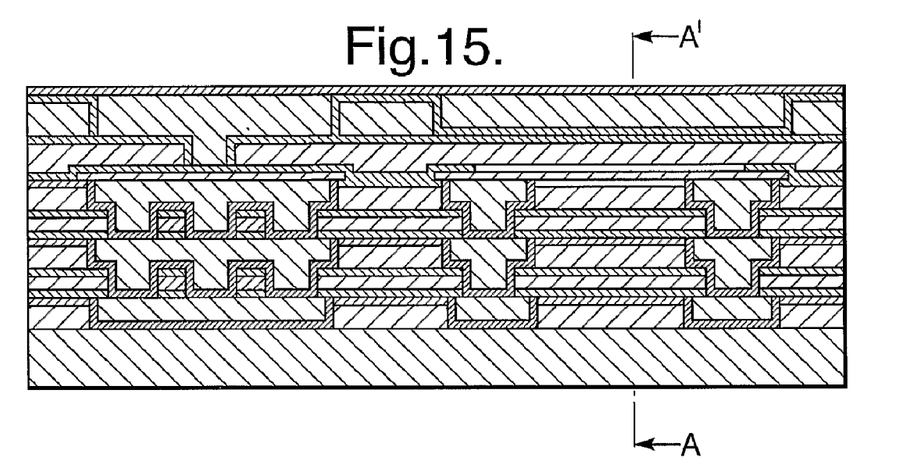
FIG. 15 shows a cross-section of the wafer according to a third example of the present invention where a copper encapsulation layer has been added to the wafer.
Figure 15A:
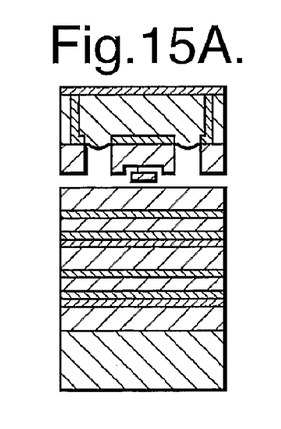
FIG. 15A shows a cross-section of the wafer of FIG. 15 along line A-A'.

Referring now to FIG. 14, it is desirable that the copper plating solution layer 240 seals the release holes 230 formed in the insulating layer 212 without entering the cavity 233 formed after removal of the sacrificial layers 216, 217. Flow of the copper plating solution into the cavity 233 may be further prevented by a variety of methods. For example, flow of the copper plating solution into the cavity 233 may be further prevented by selecting a predetermined release hole diameter that is sufficiently small. Surface tension can prevent the copper plating from flowing into the exposed cavity 233. The release hole diameters may vary from a few nanometers to the order of microns.

The present invention provides a pretreatment of the inner walls of the cavity to be applied before copper electroplating over the barrier layer lining the release holes, wherein the release holes may be surface-treated so as to provide hydrophobic surfaces. A fluorine-based dry etch or a liquid-based hydrofluoride etch could be carefully applied to the barrier layer to promote poor wetting of the copper plating solution thereto. Further as the wafer is immersed in the plating solution, the temperature and agitations can be controlled so that bubbles of gas remain in the release holes, which inhibits flow of the copper solution into the exposed cavity.

In the embodiments of the present invention, the copper electroplating step comprises the step of preparing a copper sulfate electroplating solution comprising copper sulfate, sulfuric acid, chloride, and/or additives. The copper electroplating step also comprises the step of immersing the wafer having a barrier material deposited thereon in the depositing solution prepared as described in the first step above, at room temperature or higher for 1-270 seconds.

In the present invention, the barrier layer may be formed using known Chemical Vapour Deposition (CVD) or sputtering methods. The release holes are filled using standard electroplating methods known to the skilled person in the art, and excessively deposited copper can be planarised using chemical-mechanical polishing (CMP).

The electroplating step of the present invention provides a method of copper electroplating comprising immersing a device/wafer in a copper sulfate electroplating solution containing copper sulfate, sulfuric acid chloride, and a selection of additives. The copper electroplating solution may contain, for example, 100-300 g/l of copper sulfate (CU504) and 10 to 100 g/l of sulfuric acid (H2S04)

The time of immersion in the electroplating solution is preferably in the range from 100 to 270 seconds. For example, to plate a copper layer of 1 micron, the wafer may be immersed in the electroplating solution for a period of 270 seconds at a current density of 1 Amp per square decimeter. The temperature range within which the copper plating solution may be applied is room temperature or higher. These conditions ensure a levelling plating solution. However, someone skilled in the art may readily alter the immersion times and current densities to provide levelling or conformal plating of the wafer, depending on the geometry of the wafer.

Once the copper plating steps of the present invention have been applied to the wafer, excess material is removed by a CMP step so that the surface is suitably prepared for the ensuing stages of encapsulation. In a further step, passivation layers may be applied over the copper plated layer 240 so as to provide additional sealing of the device. This may be achieved by capping the device with Tantalum Nitride or Silicon-nitride.

A person skilled in the art will appreciate that the present invention may be equally applied to encapsulating movable and non-movable structural elements such as microfuses, switches or other charge transfer elements operable within a cavity. Plating could be achieved by other methods in the field depending upon the composition of the conducting layer.

The invention claimed is:

1. A method, in a complementary metal oxide semiconductor fabrication process, of creating a layered housing containing a micro-electromechanical system device, the method comprising the steps of:
   providing a cavity in at least one layer of the housing, the cavity being accessible through via holes in a layer of insulating material deposited thereon, and the layer of insulating material being covered by a thin film layer of conductive material;
   hydrophobically treating at least a portion of the inner surface of the cavity;
   submerging the wafer in an electroplating solution; and
   electroplating a conductive layer onto the thin film layer of conductive material such that the cavity remains free of electroplating solution.

2. The method of claim 1, wherein the step of providing a cavity further comprises the steps of:
   providing a micro-electromechanical system device on a first layer of sacrificial material;
   depositing a second layer of sacrificial material on at least a portion of the micro-electromechanical system device;
   depositing a layer of insulating material on the layer of sacrificial material;
   depositing at least one thin film layer of conductive material on the layer of insulting material;
   patterning and etching via holes so as to expose at least a portion of the second layer of sacrificial material; and
   removing, through the via holes, at least a portion of the first and second layers of sacrificial material by way of etching, thereby defining a cavity in which at least a portion of the micro-electromechanical system device is contained.

3. The method of claim 1, wherein the step of providing a cavity further comprises the steps of:
   providing a micro-electromechanical system device on a first layer of sacrificial material;
   depositing a second layer of sacrificial material on at least a portion of the micro-electromechanical system device;
   depositing a layer of insulating material on the second layer of sacrificial material;
   patterning and etching via holes so as to expose at least the second layer of sacrificial material;
   removing, through the via holes, at least a portion of the first and second layers of sacrificial material by way of etching, thereby defining a cavity in which at least a portion of the micro-electromechanical system device is contained; and
   depositing at least one thin film layer of conductive material on the layer of insulating material and the inner surfaces of the via holes.

4. The method of claim 1, wherein the step of electroplating a conductive layer further comprises:
   maintaining the temperature of the electroplating solution at room temperature or higher.

5. The method of claim 1, wherein the step of electroplating a conductive layer further comprises:
   minimizing the change in temperature during the electroplating process.

6. The method of claim 1, wherein the step of electroplating a conductive layer further comprises:
   minimizing the vibration of the thin film layer during the electroplating process.

7. The method of claim 1, wherein the step of hydrophobically treating at least a portion of the inner surface of the cavity further comprises:
   treating the at least a portion of the inner surface of the cavity using a fluoride-based dry etch.

8. The method of claim 1, wherein the step of hydrophobically treating at least a portion of the inner surface of the cavity further comprises:
   treating the at least a portion of the inner surface of the cavity using a liquid-based hydrofluoric etch.

9. The method of claim 1, wherein the electroplated layer is a layer of copper.

10. The method of claim 1, wherein the thin film layer of conductive material comprises titanium.

11. The method of claim 1, wherein the thin film layer of conductive material comprises tantalum.

12. The method of claim 1, wherein the thin film layer of conductive material comprises copper.

* * * * *